(12) United States Patent
Dozaka

(10) Patent No.: US 9,691,499 B1
(45) Date of Patent: Jun. 27, 2017

(54) SEMICONDUCTOR MEMORY DEVICE

(71) Applicant: Kabushiki Kaisha Toshiba, Minato-ku, Tokyo (JP)

(72) Inventor: Toshiaki Dozaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/246,805

(22) Filed: Aug. 25, 2016

(30) Foreign Application Priority Data

Feb. 8, 2016 (JP) ................................ 2016-021847

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/16; G11C 17/18
See application file for complete search history.

(56) References Cited

U.S. PATENT DOCUMENTS

| 8,154,903 | B2 * | 4/2012 | Jung | ....................... | G11C 11/16 365/148 |
| 8,750,018 | B2 * | 6/2014 | Youn | .................. | G11C 13/0002 365/148 |
| 2002/0051399 | A1 | 5/2002 | Tanizaki et al. | | |
| 2007/0237018 | A1 | 10/2007 | Kenkare et al. | | |
| 2008/0316789 | A1 | 12/2008 | Fredeman et al. | | |
| 2012/0044736 | A1 * | 2/2012 | Chung | ................ | G11C 11/1659 365/66 |

FOREIGN PATENT DOCUMENTS

| JP | 2002-134620 A | 5/2002 |
| JP | 2009-506577 A | 2/2009 |
| JP | 2009-533729 A | 9/2009 |
| JP | 2013-143157 A | 7/2013 |

* cited by examiner

*Primary Examiner* — Tri Hoang
(74) *Attorney, Agent, or Firm* — White & Case LLP

(57) ABSTRACT

According to one embodiment, the semiconductor memory device includes a memory element, a reference resistance element, a read circuit, and a first circuit. The memory element is enabled to take a first resistance value and a second resistance value. The reference resistance element configured to have a resistance value between the first resistance value and the second resistance value. The read circuit is configured to determine data read from the memory element based on a current flowing through the memory element and a current flowing through the reference resistance element. The first circuit is configured to suppress the currents flowing through the memory element and the reference resistance element in response to determination of data read from the memory element.

16 Claims, 7 Drawing Sheets

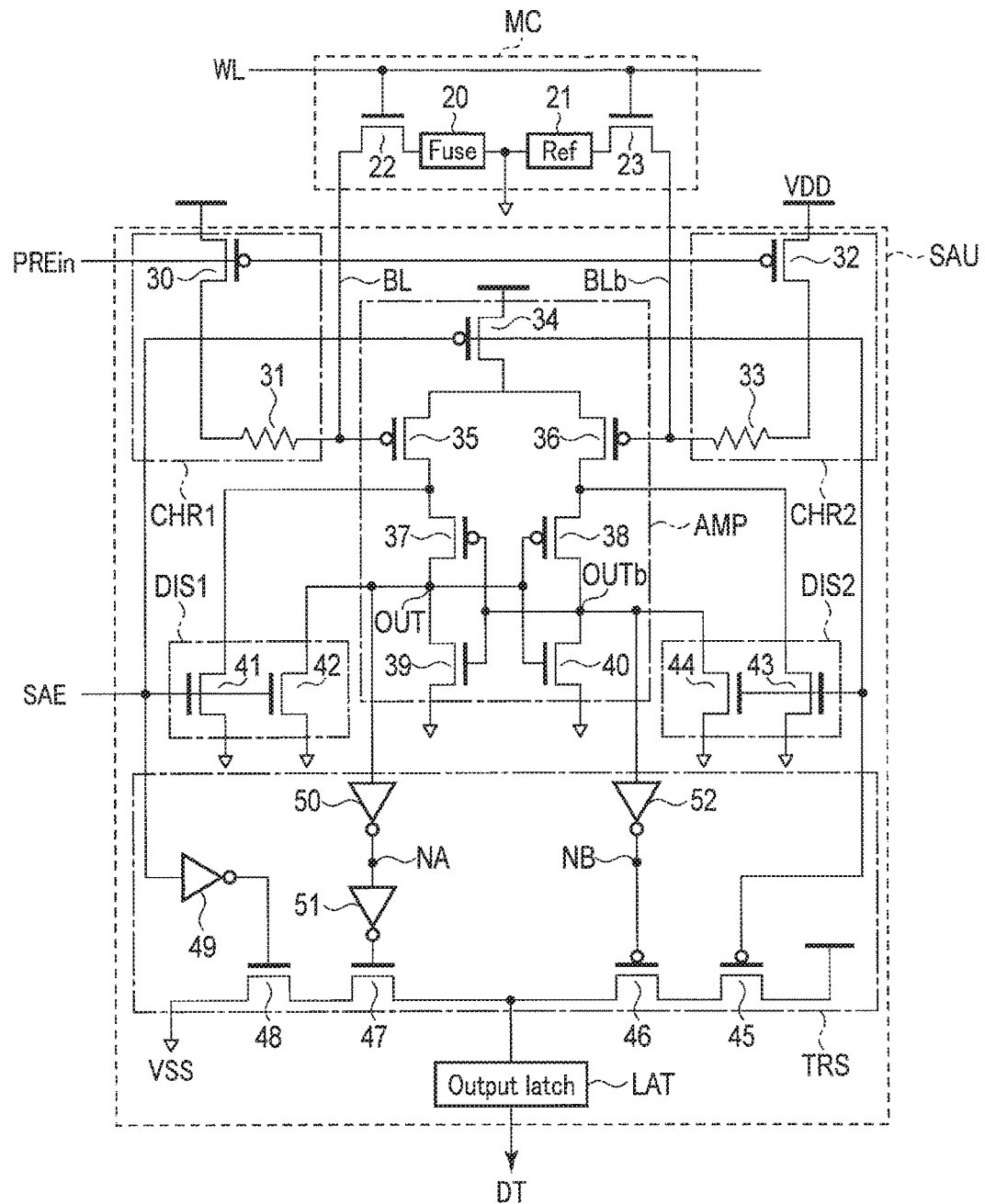
F I G. 2

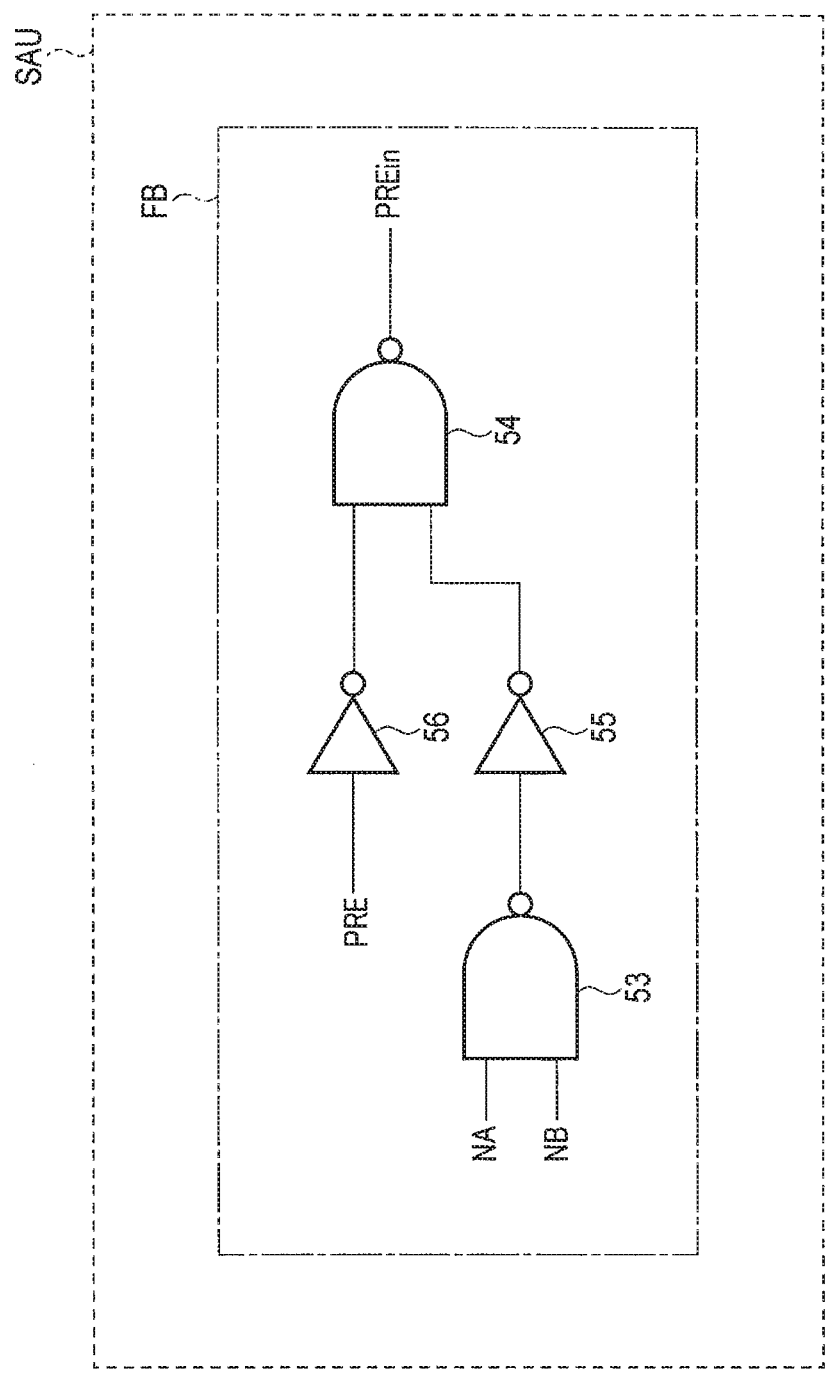
F I G. 3

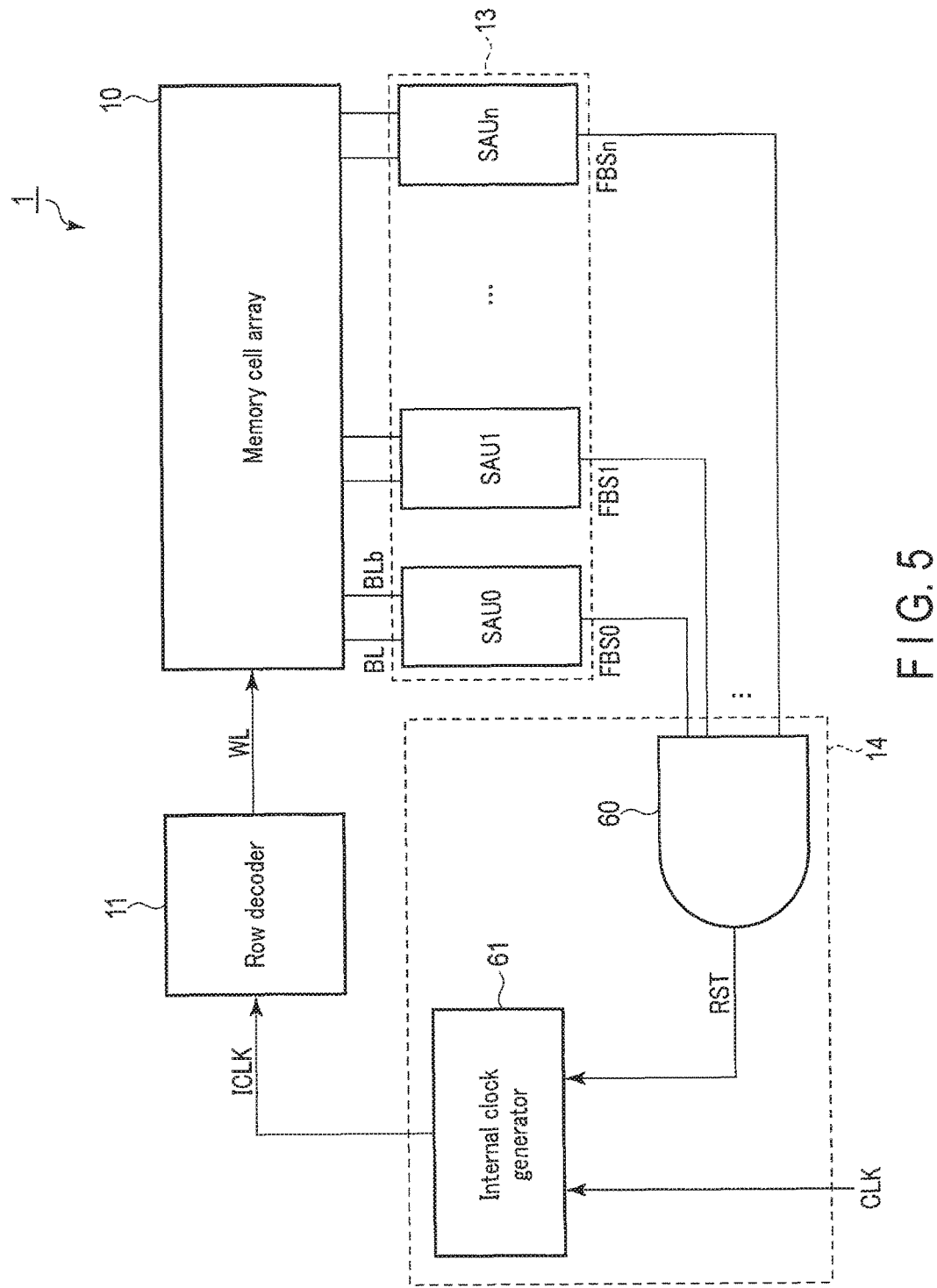
F I G. 5

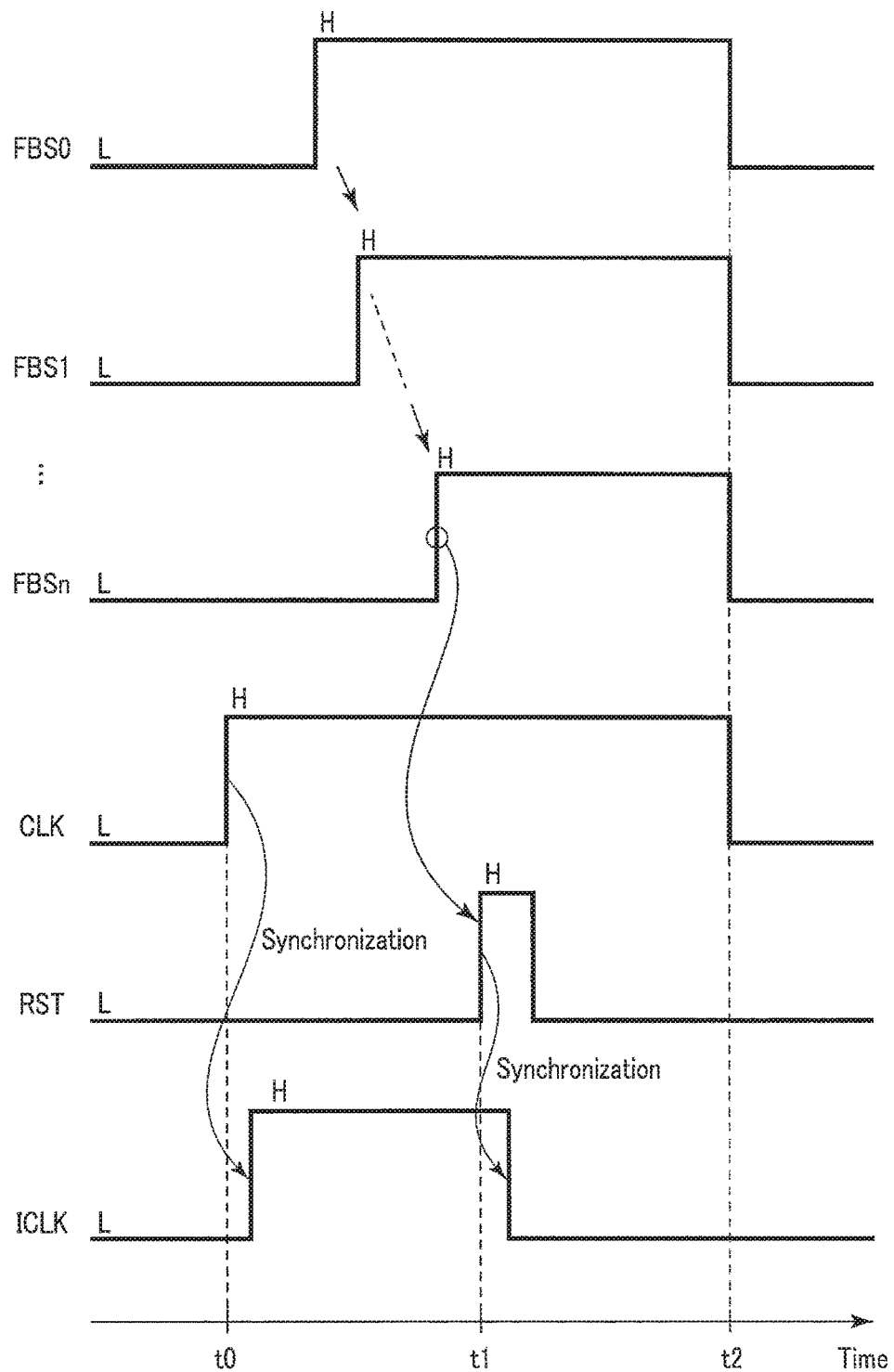
F I G. 6

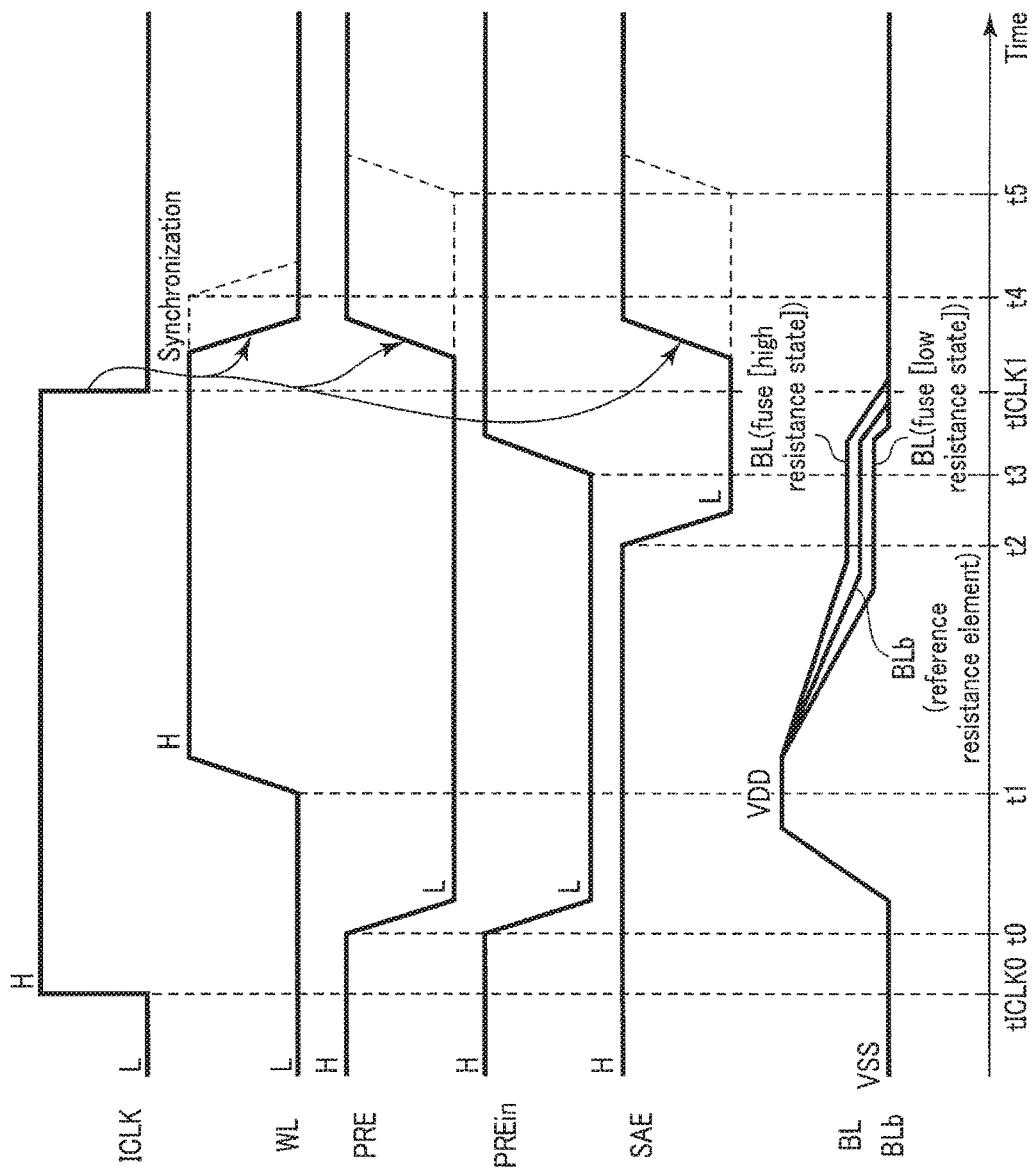
F I G. 7

SEMICONDUCTOR MEMORY DEVICE

CROSS-REFERENCE TO RELATED APPLICATIONS

This application is based upon and claims the benefit of priority from Japanese Patent Application No. 2016-021847, filed Feb. 8, 2016, the entire contents of which are incorporated herein by reference.

FIELD

Embodiments described herein relate generally to a semiconductor memory device.

BACKGROUND

Resistance change memory is known as a type of a semiconductor memory device. The resistance change memory includes memory cells each with a variable resistance value and reference resistors. In a read operation in the resistance change memory, a current is passed through each of the memory cells and reference resistors. Then, a difference in potential between nodes to which each memory cell and the corresponding reference resistor are connected is amplified, and the amplified difference is latched to allow data stored in the memory cell to be determined. There has been a demand to allow a determination circuit used for such a read operation to operate with low power consumption.

BRIEF DESCRIPTION OF THE DRAWINGS

FIG. 2 is a circuit diagram of a memory cell and a sense amplifier unit according to the first embodiment;

FIG. 3 is a circuit diagram of the sensor amplifier unit according to the first embodiment;

FIG. 5 is a block diagram of a semiconductor memory device according to a second embodiment;

FIG. 6 is a timing chart of a read operation in the semiconductor memory device according to the second embodiment; and FIG. 7 is a timing chart of a read operation in the semiconductor memory device according to the second embodiment.

DETAILED DESCRIPTION

Figure 1:
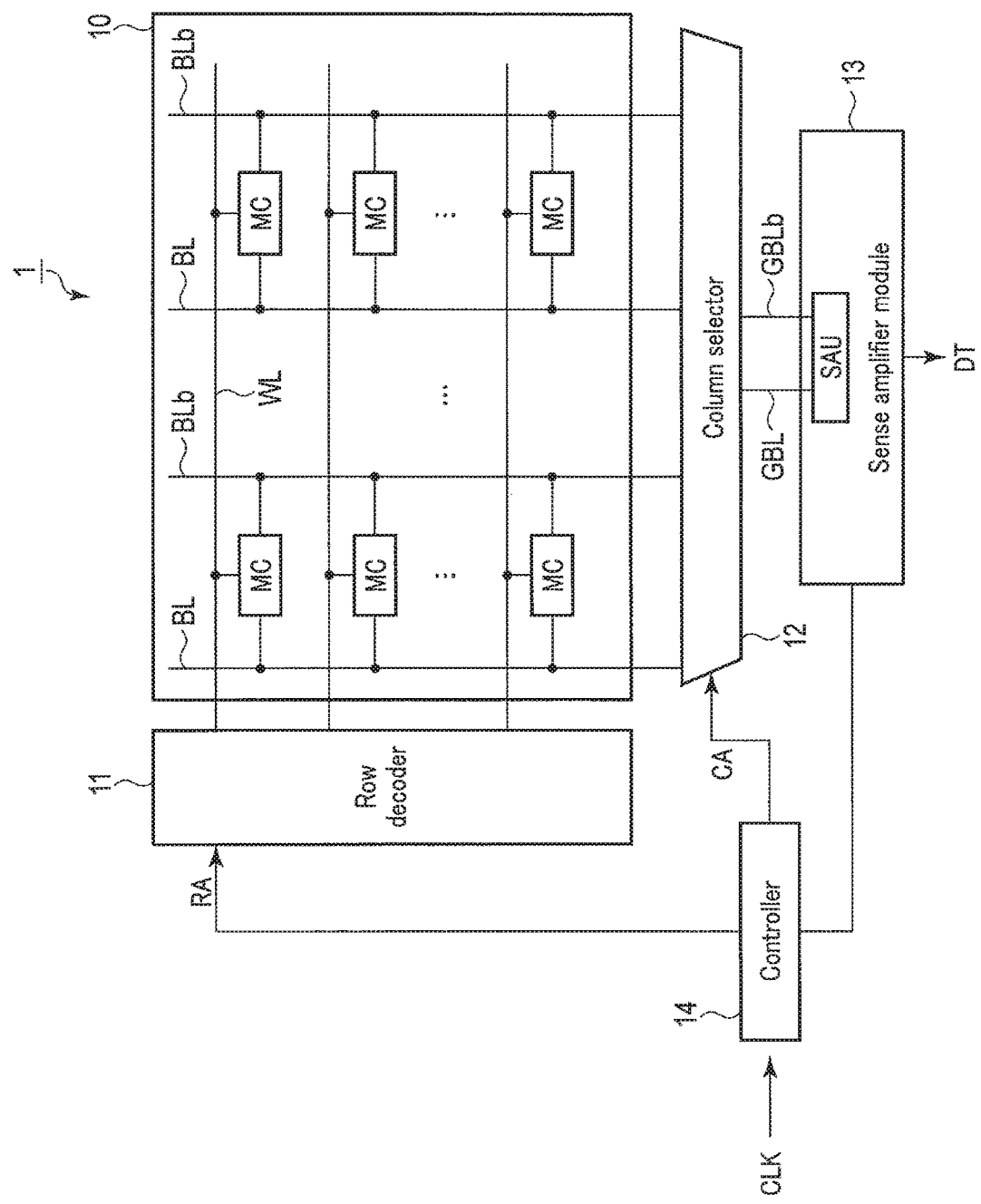
FIG. 1 is a block diagram of a semiconductor memory device according to a first embodiment.

In general, according to one embodiment, a semiconductor memory device includes a first memory element, a first reference resistance element, first and second bit lines, first and second transistors, and a first read circuit. The first memory element is enabled to take a first resistance value and a second resistance value different from the first resistance value. The first reference resistance element is configured to have a resistance value between the first resistance value and the second resistance value. The first bit line is connected to the memory element. The second bit line is connected to the reference resistance element. A first signal is input to gates of the first and second transistors. One ends of the first and second transistors are connected to a power supply terminal. The other ends of the first and second transistors are connected to the first and second bit lines, respectively. The first read circuit is configured to sense a difference in potential between the first bit line and the second bit line to determine data read from the first memory element. In a read operation on the first memory element, the first signal changes from a first logic level to a second logic level different from the first logic level in response to the determination of the data read from the first memory element, and a voltage of the first bit line lowers from a first voltage to a second voltage and a voltage of the second bit line lowers from a third voltage to the second voltage when the first signal changes to the second logic level. The third voltage is different from the first voltage.

Embodiments will be described below with reference to the drawings. In the description below, components having substantially the same functions and configurations are denoted by the same reference numerals. The drawings are schematic. Each of the embodiments illustrates an apparatus or a method which embodies technical concepts of the embodiment. The technical concepts of the embodiment do not limit materials, shapes, structures, arrangements, and the like of the components to those described below.

[1] First Embodiment

A semiconductor memory device according to a first embodiment will be described.

[1-1] Configuration

[1-1-1] Configuration of the Semiconductor Memory Device 1

First, with reference to FIG. 1, a configuration of a semiconductor memory device 1 according to a first embodiment will be described.

As depicted in FIG. 1, the semiconductor memory device 1 includes a memory cell array 10, a row decoder 11, a column selector 12, a sense amplifier module (determination circuit) 13, and a controller 14.

The memory cell array 10 includes a plurality of memory cells MC which can store data. The memory cells MC are arranged in a matrix. To control voltages applied to the memory cells MC, the memory cell array 10 is provided with a plurality of word lines WL and a plurality of bit line pairs (a bit line BL and a bit line BLb). The word lines WL are, for example, extended along a row direction. The bit line pairs are, for example, extended along a column direction orthogonal to the row direction. The memory cells MC are provided at respective intersection points between the word lines WL and the bit line pairs. Each of the memory cells MC connects to a corresponding one of the word lines WL and a corresponding one of the bit line pairs.

The row decoder 11 selects one of the word lines WL based on a row address signal RA received from the controller 14, and applies a voltage to the selected word line WL. The row address signal RA is supplied by an external controller (not depicted in the drawings).

The column selector 12 selects one of the bit line pairs based on a column address signal CA received from the controller 14. The column selector 12 electrically connects the selected bit line pair and a global bit line pair (a bit line GBL and a bit line GBLb). The column address signal CA is supplied by the external controller. The global bit line pair is an interconnect provided to connect the column selector 12 and the sense amplifier module 13 together.

The sense amplifier module 13 includes a sense amplifier unit SAU connected to the global bit line pair. During a read operation, the sense amplifier unit SAU senses data stored in the memory cell MC corresponding to the selected word line WL and the selected bit line pair. Read data DT is output to the exterior of the semiconductor memory device 1.

The controller 14 controls operations of the semiconductor memory device 1 as a whole in accordance with external control signals received from the external controller and the like. The external control signals include, for example, a clock signal CLK which controls a timing for an operation.

The semiconductor memory device 1 is not limited to the above-described configuration and may be in any of various forms. For example, a plurality of bit line pairs may be classified into a plurality of groups so that the column selector 12 can select one bit line pair for each group. In this case, the sense amplifier module 13 includes a plurality of sense amplifier units SAU corresponding to the respective groups. Each of the sense amplifier units SAU is connected to the column selector 12 via the global bit line pair corresponding to each of the groups.

The column selector 12 may be omitted from the semiconductor memory device 1. In this case, the bit line pairs and the sense amplifier unit SAU are directly connected together. The sense amplifier module 13 includes a plurality of sense amplifier units SAU corresponding to the respective bit line pairs.

[1-1-2] Circuit Configuration of the Memory Cell MC

Now, a circuit configuration of the memory cell MC will be described using FIG. 2 and taking, as an example, the use of a fuse element as a memory element which stores data.

As depicted in FIG. 2, the memory cell MC includes a fuse element (memory element) 20, a reference resistance element 21, and transistors 22 and 23.

The fuse element 20 is a variable resistance element which takes either a high resistance state (for example, 2 kΩ) or a low resistance state (for example, 200Ω). The high resistance state and the low resistance state are defined to be data "1" and data "0", respectively, to allow the fuse element 20 to store 1-bit data. Allocation between the data and the resistance states of the fuse element 20 can be optionally set. The fuse element 20 transitions from the low resistance state to the high resistance state when, for example, a current is passed through the fuse element to cause electromigration to cut off an internal interconnect. Upon transitioning to the high resistance state, the fuse element 20 is precluded from returning to the low resistance state. Thus, the fuse element 20 is used, for example, as a memory element for an OTPRAM (One Time Programmable Random Access Memory).

The reference resistance element 21 has a resistance value (for example, 1 kΩ) between values for the high resistance state and low resistance state of the fuse element 20. A current flowing through the reference resistance element 21 in a read operation has a current value which is substantially intermediate between the value of a current flowing through the fuse element 20 storing "1" data and the value of a current flowing through the fuse element 20 storing "0" data.

The n-channel MOS transistors 22 and 23 are used to select from the memory cells MC and configured to be turned on when a current is passed through the corresponding fuse element 20 and the corresponding reference resistance element 21.

One end of the fuse element 20 is connected to a source of the transistor 22. The other end of the fuse element 20 is connected to a ground terminal. One end of the reference resistance element 21 is connected to a source of the transistor 23. The other end of the reference resistance element 21 is connected to the ground terminal. Drains of the transistors 22 and 23 are connected to the respective bit lines BL and BLb. Gates of the transistors 22 and 23 are connected to the corresponding word line WL. The manner in which, in the memory cell MC, the fuse element 20 and the reference resistance element 21 are connected to the transistors 22 and 23 is not limited to the present example. The fuse element 20 and the transistor 22 may be interchanged with each other. The reference resistance element 21 and the transistor 23 may be interchanged with each other. In this case, one end of the fuse element 20 is connected to the bit line BL, and the other end of the fuse element 20 is connected to the drain of the transistor 22. One end of the reference resistance element 21 is connected to the bit line BLb, and the other end of the reference resistance element 21 is connected to the drain of the transistor 23. The sources of the transistors 22 and 23 are connected to the ground terminal.

In the above-described configuration, for example, a ground voltage VSS of the semiconductor memory device 1 is applied to the ground terminal connected to the other end of the fuse element 20 and to the other end of the reference resistance element 21.

The configuration of the memory cell MC is not limited to the above-described configuration, and the memory cell MC may be in any of various forms. For example, the memory cell MC may be a resistance change memory element such as a ReRAM (Resistance Random Access Memory), a PRAM (Phase-change RAM), an FeNAND (Ferroelectric NAND-type memory), an MRAM (Magnetic Random Access Memory), or an iPCM (interfacial Phase-Change Memory).

[1-1-3] Circuit Configuration of the Sense Amplifier Unit SAU

Now, a circuit configuration of the sense amplifier unit SAU will be described using FIG. 2 and FIG. 3. FIG. 2 depicts a configuration in which the column selector 12 and the global bit line pair are omitted and in which the bit line pair is connected directly to the sense amplifier unit SAU, for simplification of description. FIG. 3 depicts a circuit configuration included in the sense amplifier unit SAU depicted in FIG. 2.

The sense amplifier unit SAU includes precharge circuits CHR1 and CHR2, an amplifying circuit AMP, discharge circuits DIS1 and DIS2, a data transfer circuit TRS, and an output latch circuit LAT as depicted in FIG. 2, and includes a feedback circuit FB as depicted in FIG. 3.

The precharge circuits CHR1 and CHR2 precharge the bit lines BL and BLb based on a precharge signal PREin. The precharge circuit CHR1 includes a transistor 30 and a resistance element 31. A source of the p-channel MOS transistor 30 is connected to a power supply terminal. The precharge signal PREin is input to a gate of the transistor 30. One end of the resistance element 31 is connected to a drain of the transistor 30. The other end of the resistance element 31 is connected to the bit line BL. The precharge circuit CHR2 includes a transistor 32 and a resistance element 33. A source of the p-channel MOS transistor 32 is connected to the power supply terminal. The precharge signal PREin is input to a gate of the transistor 32. One end of the resistance element 33 is connected to a drain of the transistor 32. The other end of the resistance element 33 is connected to the bit line BLb. The precharge signal PREin is a control signal output by the feedback circuit FB based on a precharge signal PRE and a data determination result from the sense amplifier unit SAU. The precharge signal PRE is a control signal issued by the controller 14. The resistance elements 31 and 33 are confirmed to have, for example, a substantially equal resistance value.

The amplifying circuit AMP is activated by a sense enable signal SAE to amplify a difference in potential between the bit lines BL and BLb to determine data read from the memory cell MC. The amplifying circuit AMP includes transistors 34 to 40. A source of the p-channel transistor 34 is connected to the power supply terminal. The sense enable signal SAE is input to a gate of the transistor 34. The sense enable signal SAE is a control signal issued by the controller 14. Sources of the p-channel MOS transistors 35 and 36 are connected to a drain of the transistor 34. Gates of the transistors 35 and 36 are connected to the bit lines BL and BLb, respectively. Sources of the p-channel MOS transistors 37 and 38 are connected to drains of the transistors 35 and 36, respectively. Drains of the transistors 37 and 38 are connected to nodes OUT and OUTb, respectively. Drains of the n-channel MOS transistors 39 and 40 are connected to the nodes OUT and OUTb, respectively. Sources of the transistors 39 and 40 are connected to the ground terminal. Gates of the transistors 39 and 40 are connected to gates of the transistors 37 and 38, respectively. The transistors 37 to 40 provide a latch circuit which holds data at the nodes OUT and OUTb.

The discharge circuits DIS1 and DIS2 discharge the nodes OUT and OUTb, respectively, based on the sense enable signal SAE. The discharge circuit DIS1 includes n-channel MOS transistors 41 and 42. Drains of the transistors 41 and 42 are connected to a source of the transistor 37 and the node OUT, respectively. Sources of the transistors 41 and 42 are connected to the ground terminal. The sense enable signal SAE is input to gates of the transistors 41 and 42. The discharge circuit DIS2 includes n-channel MOS transistors 43 and 44. Drains of the transistors 43 and 44 are connected to a source of the transistor 38 and the node OUTb, respectively. Sources of the transistors 43 and 44 are connected to the ground terminal. The sense enable signal SAE is input to gates of the transistors 43 and 44.

The data transfer circuit TRS transfers data DT read from the memory cell MC to the output latch circuit LAT based on the sense enable signal SAE and the data determination result from the amplifying circuit AMP. The data transfer circuit TRS includes transistors 45 to 48 and inverter circuits 49 to 52. A source of the p-channel transistor 45 is connected to the power supply terminal. The sense enable signal SAE is input to a gate of the transistor 45. A source of the p-channel MOS transistor 46 is connected to a drain of the transistor 45. A gate of the transistor 46 is connected to a node NB. A drain of the n-channel MOS transistor 47 is connected to a drain of the transistor 46. A drain of the n-channel MOS transistor 48 is connected to a source of the transistor 47. A source of the transistor 48 is connected to the ground terminal. The sense enable signal SAE is input to an input terminal of the inverter circuit 49. An output terminal of the inverter circuit 49 is connected to a gate of the transistor 48. An input terminal of the inverter circuit 50 is connected to the node OUT. An output terminal of the inverter circuit 50 is connected to the node NA. An input terminal of the inverter circuit 51 is connected to the node NA. An output terminal of the inverter circuit 51 is connected to a gate of the transistor 47. An input terminal of the inverter circuit 52 is connected to the node OUTb. An output terminal of the inverter circuit 52 is connected to the node NB.

The output latch circuit LAT temporarily holds the data read from the memory cell MC and outputs the read data DT to the exterior based on an instruction from the controller 14. The output latch circuit LAT is connected to the drain of the transistor 46.

The feedback circuit FB senses the determination of the read data and feeds the determination back to the precharge signal PREin. The feedback circuit FB includes NAND circuits 53 and 54 and inverter circuits 55 and 56. A first input terminal of the NAND circuit 53 is connected to the node NA. A second input terminal of the NAND circuit 53 is connected to the node NB. An output terminal of the NAND circuit 53 is connected to an input terminal of the inverter circuit 55. The precharge signal PRE is input to a first input terminal of the NAND circuit 54 via the inverter circuit 56. A second input terminal of the NAND circuit 54 is connected to an output terminal of the inverter circuit 55. In other words, a signal that is synchronized with the precharge signal PRE is input to the first input terminal of the NAND circuit 54, and a signal via the output terminal of the NAND circuit 53 is input to the second input terminal of the NAND circuit 54. The precharge signal PREin is output from an output terminal of the NAND circuit 54. The number of inverter circuits provided between the output terminal of the NAND circuit 53 and the second input terminal of the NAND circuit 54 and the number of inverter circuits via which the precharge signal PRE is input are not limited to the above-described values. Any number of inverter circuits may be provided as long as an odd number of inverter circuits may be connected in series.

In the above-described configuration, for example, a power supply voltage VDD of the semiconductor memory device 1 is applied to the power supply terminal connected to the sources of the transistors 30, 32, 34, and 45. For example, a ground potential VSS of the semiconductor memory device 1 is applied to the ground terminal connected to the fuse element 20, the reference resistance element 21, and the sources of the transistors 39 to 44 and the transistor 48.

The configuration of the sense amplifier unit SAU is not limited to the above-described configuration. The sense amplifier unit SAU may be in any of various forms. For example, the NAND circuits and inverter circuits depicted in FIG. 3 can be replaced with a set of a NOR circuit and an even number of inverter circuits. A logic circuit included in the sense amplifier unit may have a different circuit configuration. For example, any circuit configuration may be used as long as control signals which allow for the same operations as those in the above-described embodiment can be output using a combination of logic circuits such as a NAND circuit, an AND circuit, NOR circuit, an OR circuit, and an inverter circuit.

[1-2] Read Operation

Figure 4:
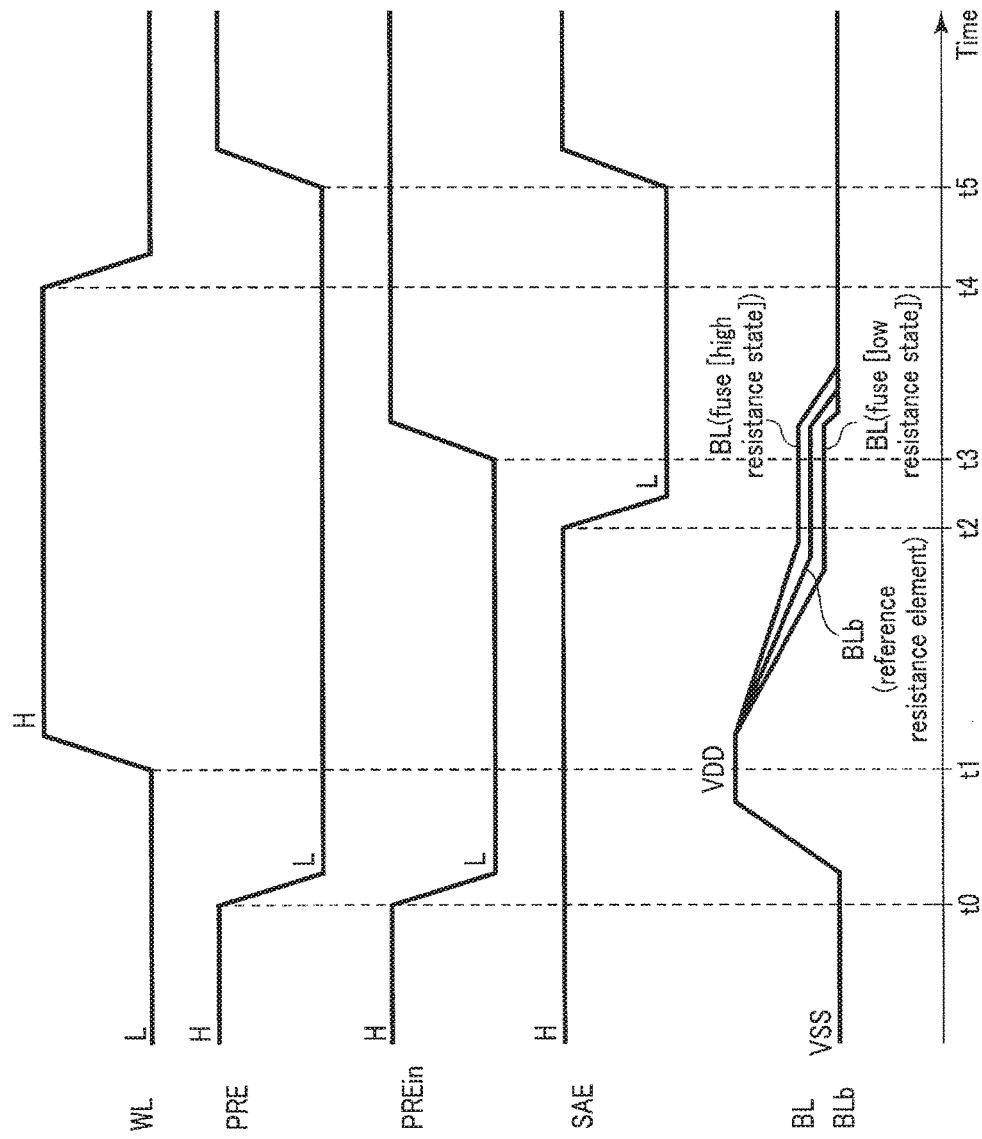
FIG. 4 is a timing chart of a read operation in the semiconductor memory device according to the first embodiment.

Now, the read operation in the semiconductor memory device 1 will be described using FIG. 4.

First, a standby state preceding the read operation will be described.

In the standby state, the row decoder 11 sets the voltage of each of the word lines WL to an "L" level to set the corresponding transistors 22 and 23 to an off state. Consequently, the corresponding memory cell MC is set to an unselected state.

The controller 14 sets the sense enable signal SAE to an "H" level to set the transistors 34, 45, and 48 to the off state. Thus, the amplifying circuit AMP is set to an inactive state, while the discharge circuits DIS1 and DIS2 are set to an active state. When the discharge circuits DIS1 and DIS2 are set to the active state, nodes to which the sources and drains of the transistors 37 and 38 are connected are discharged. Accordingly, both voltages of the nodes NA and NB are set to the "H" level. When the transistors 45 and 48 are set to the off state, the determination result from the amplifying circuit AMP is prevented from being transferred to the output latch circuit LAT.

The controller 14 sets the precharge signal PRE to the "H" level. In the standby level, both the voltages of the nodes NA and NB are at the "H" level, and thus, the NAND circuit 53 outputs a signal at the "L" level. The signal output by the NAND circuit 53 and the precharge signal PRE are inverted by the inverter circuits 55 and 56. Thus, a signal at the "H" level and a signal at the "L" level are input to the respective two input terminals of the NAND circuit 54. Consequently, the precharge signal PREin output by the NAND circuit 54 is set to the "H" level, and the transistors 30 and 32 are set to the off state. This brings the bit lines BL and BLb into a floating state.

Now, operations performed from start to end of the read operation will be described using FIG. 4.

First, at time t0, the controller 14 sets the precharge signal PRE to the "L" level. When the precharge signal PRE is set to the "L" level, both the signals input to the two input terminals of the NAND circuit 54 are set to the "H" level. Thus, the precharge signal PREin is set to the "L" level. When the precharge signal PREin is set to the "L" level, the transistors 30 and 32 are set to the on state, allowing the bit lines BL and BLb to be precharged to a precharge potential. The precharge potential is, for example, the power supply voltage VDD of the semiconductor memory device 1.

Then, at time t1, the row decoder 11 sets the voltage of the word line WL to the "H" level to select the memory cell MC from which data it to read. When the voltage of the word line WL is set to the "H" level, the transistors 22 and 23 connected to this selected word line WL are set to the on state. Charge stored in the bit lines BL and BLb is discharged toward the ground terminal via the fuse element 20 and the reference resistance element 21, respectively. A current flowing through the fuse element 20 at this time is larger than a current flowing through the reference resistance element 21 when the fuse element 20 is in a low resistance state, and is smaller than a current flowing through the reference resistance element 21 when the fuse element 20 is in a high resistance state. In other words, a discharge rate of the bit line BL obtained when the fuse element 20 stores "0" data is higher than a discharge rate of the bit line BLb. A voltage of the bit line BL is set to a given value based on resistance values of the resistance element 31 and the fuse element 20. A voltage of the bit line BLb is set to a given value based on resistance values of the resistance element 33 and the reference resistance element 21.

Then, at time t2, the controller 14 sets the sense enable signal SAE to the "L" level. When the sense enable signal SAE is set to the "L" level, the transistor 34 is set to the on state, allowing the amplifying circuit AMP to be activated. The transistors 41 to 44 are set to the off state to set the discharge circuits DIS1 and DIS2 to the inactive state. The transistors 45 and 48 are set to the on state, allowing the read data to be transferred to the output latch circuit LAT. The amplifying circuit AMP amplifies the difference in potential between the bit lines BL and BLb to determine the data stored in the memory cell MC.

When the fuse element 20 is in the low resistance state, the voltage of the bit line BL is lower than the voltage of the bit line BLb. Consequently, a voltage applied to the gate of the transistor 35 is higher than a voltage applied to the gate of the transistor 36, allowing more of the current supplied by the transistor 34 to flow into the transistor 35. As a result, the potential of the node OUT rises faster than the potential of the node OUTb. Then, the potential of the node OUT exceeds an inversion threshold of the inverter circuit 50 at a certain point in time to invert the voltage of the node NA from the "H" level to the "L" level. Thus, the voltage of the node OUT is set to the "H" level, and the voltage of the node OUTb is set to the "L" level (VSS), allowing read data to be determined. As a result, a signal at the "H" level is input from the node OUT to the gate of the transistor 47 via the inverter circuits 50 and 51. A signal at the H level is input from the node OUTb to the gate of the transistor 46 via the inverter circuit 52. Then, the transistors are set to the off state and the on state, respectively, allowing a current to be discharged from the output latch circuit LAT via the transistors 47 and 48. Consequently, the output latch circuit LAT holds "0" data.

On the other hand, when the fuse element 20 is in the high resistance state, the voltage of the bit line BL is higher than the voltage of the bit line BLb. Thus, when the fuse element 20 is in the high resistance state, operations are performed which are reverse to the operations performed when the fuse element 20 is in the low resistance state. As a result, the transistors 46 and 47 are set to the on state and the off state, respectively, to allow currents to be fed to the output latch circuit LAT via the transistors 45 and 46. Consequently, the output latch circuit LAT holds "1" data.

As described above, when the amplifying circuit AMP determines the data stored in the memory cell MC, the voltage of one of the nodes OUT and OUTb is set to the "H" level, whereas the voltage of the other of the nodes OUT and OUTb is set to the "L" level. Then, for the voltages of the nodes NA and NB input to the NAND circuit 53, the voltage of one of the nodes NA and NB is set to the "H" level, whereas the voltage of the other of the nodes NA and NB is set to the "L" level. This allows an output from the NAND circuit 53 to be set to the "H" level. Consequently, to one of the two input terminals of the NAND circuit 54, a signal at the "H" level is input which results from inversion, by the inverter circuit 56, of the precharge signal PRE at the "L" level. To the other of the two input terminals of the NAND circuit 54, a signal at the "L" level is input which results from the inversion, by the inverter circuit 55, of the output from the NAND circuit 53 at the "H" level. As a result, at time t3, the precharge signal PREin output by the NAND circuit 54 is at the "H" level.

When the precharge signal PREin is set to the "H" level, the transistors 30 and 32 are set to the off state to reduce the voltages of the bit lines BL and BLb down to the ground voltage VSS.

Then, at time t4, the row decoder 11 sets the voltage of the word line WL to the "L" level to set the transistors 22 and 23 to the off state.

Then, at time t5, the controller 14 sets the precharge signal PRE and the sense enable signal SAE to the "H" level. This brings the semiconductor memory device 1 into the standby state to end the read operation.

As described above, in the read operation in the semiconductor memory device 1, the difference in potential between the bit lines BL and BLb is sensed to allow the data stored in the memory cell MC to be determined, and when the determination of the data is ended, the currents being fed through the bit lines BL and BLb are cut off.

[1-3] Effects of the First Embodiment

The semiconductor memory device 1 according to the present embodiment can suppress power consumption during the read operation. The effects of the present embodiment will be described below.

Resistance change memory, which is a type of semiconductor memory device, uses a read scheme involving passing a current through the memory element and the reference resistance element and sensing the difference in resistance value between the memory element and the reference resistance element based on the potential difference to determine the data. For example, reading in an OTPRAM including fuse elements serving as memory elements needs a read circuit that determines a potential difference of several tens of mV to be a resistance difference of several hundred to several thousand Ω.

However, a current of several hundred µA to 1 mA needs to be continuously passed through the memory element and the reference resistance element in order to allow reading of a potential difference of several tens of mV corresponding to a resistance difference of several hundred to several thousand Ω. A through-current flowing through the memory element and the reference resistance element during the read period continues to flow until the end of the read period even after the determination of the read data is ended. The through-current totals several mA at a macro level, increasing the power consumption of the read operation.

Thus, the sense amplifier module 13 in the semiconductor memory device according to the first embodiment includes the feedback circuit FB (the NAND circuits 53 and 54 and the inverter circuits 55 and 56). The feedback circuit FB controls the transistors 30 and 32, which feed currents to the bit lines BL and BLb, in accordance with the precharge signal PRE issued by the controller 14 and the state of the read data determined by the sense amplifier module 13. During the read period, the feedback circuit FB keeps the transistors 30 and 32 in the on state until the read data is determined, and after the read data is determined, cuts off the transistors 30 and 32. In other words, the feedback circuit FB blocks the through-current flowing through the memory element 20 and the reference resistance element 21 in responses to the determination of the data read from the memory element 20. The voltage of the bit lines BL and BLb change to VSS when the transistors 30 and 32 are cut off.

Thus, the semiconductor memory device 1 according to the present embodiment enables inhibition of flow of more through-current than needed, allowing suppression of power consumption during the read operation. The need for the feedback circuit FB to take a margin for a variation into account is eliminated, allowing suppression of power consumption without concern for malfunctioning. The power consumption of the semiconductor memory device 1 according to the present embodiment can be reduced, for example, to approximately one tenth of the power consumption in the case where the feedback circuit FB is not provided.

When the semiconductor memory device 1 includes a plurality of sense amplifier units SAU to simultaneously read data from a plurality of memory cells MC, a timing when the sense amplifier unit SAU determines the read data may vary according to differences in the data stored in the memory cell MC, variations in characteristics in the semiconductor memory device 1, or the like. In such a case, the feedback circuits FB in the sense amplifier units SAU operate according to different timings. In other words, current paths along the bit lines BL and BLb corresponding to each sense amplifier unit SAU are cut off at the optimum timing for the characteristics of the sense amplifier unit SAU. Consequently, the semiconductor memory device 1 according to the present embodiment can suppress power consumption in accordance with variations in characteristics in the semiconductor memory device 1.

[2] Second Embodiment

Now, a semiconductor memory device 1 according to a second embodiment will be described. The semiconductor memory device 1 according to the second embodiment has the configuration described in the first embodiment and further feeds back statuses of read data determined by a plurality of sense amplifier units SAU. The semiconductor memory device 1 then resets the row decoder 11 based on the feedback information. Only differences from the first embodiment will be described.

[2-1] Configuration of the Semiconductor Memory Device 1

First, a configuration of a semiconductor memory device 1 according to a second embodiment will be described using FIG. 5. FIG. 5 is a block diagram of the semiconductor memory device 1 according to the present embodiment and corresponds to FIG. 1 described in the first embodiment. However, FIG. 5 depicts a configuration in which the column selector 12 and the global bit line pair are omitted and in which the bit line pair is connected directly to the sense amplifier unit SAU, for simplification of description. As depicted in FIG. 5, the semiconductor memory device 1 has the configuration described in FIG. 1 and in which the sense amplifier module 13 includes sense amplifier units SAU0 to SAUn (n is an integer of 1 or more) and in which the controller 14 comprises an AND circuit 60 and an internal clock generator 61.

Each of the sense amplifier units SAU is connected to the bit line pair including the bit line BL and the bit line BLb. The sense amplifier units SAU0 to SAUn output feedback signals FBS0 to FBSn. The feedback signal FBS is a signal output during a read operation. The sense amplifier unit SAU keeps the feedback signal FBS at the "L" level while data is being determined, and sets the feedback signal FBS to the "H" level when the determination of the data is ended. The feedback signal FBS may be generated by dividing, into branches, a node to which the precharge signal PREin is input and providing an odd number of inverter circuits on the respective branches. The output feedback signals FBS0 to FBSn are input to respective input terminals of the AND circuit 60.

The AND circuit 60 performs a logical AND operation on the feedback signals FBS0 to FBSn and outputs the result of the operation as a reset signal RST. The reset signal RST resets the state of the semiconductor memory device 1 and brings the semiconductor memory device 1 into the standby state.

The internal clock generator 61 controls, for example, operation timings for the row decoder 11 and the sense amplifier module 13. The internal clock generator 61 receives a clock signal CLK fed from a controller located outside the semiconductor memory device 1 and the reset signal RST. The internal clock generator 61 generates an internal clock signal ICLK based on the clock signal CLK and the reset signal RST. The internal clock signal ICLK is input to the row decoder 11. Timing is controlled when the row decoder 11 applies a voltage to the word line WL based on the internal clock signal ICLK. The sense enable signal SAE supplied to the sense amplifier module 13 is generated based on the internal clock signal ICLK.

[2-2] Read Operation

Now, a read operation in the semiconductor memory device 1 according to the second embodiment will be described using FIG. 6 and focusing on a method for generating an internal clock signal ICLK. In the following description, the read data is determined in order of the sense amplifier unit SAU0 to the sense amplifier unit SAUn.

In an initial state, the clock signal CLK, the internal clock signal ICLK, the reset signal RST, and the feedback signals FBS0 to FBSn are at the "L" level.

First, at time t0, the external controller sets the clock signal CLK to the "H" level. When the clock signal CLK is set to the "H" level, the internal clock generator 61 sets the internal clock signal ICLK to the "H" level in synchronism with the clock signal CLK. The row decoder 11, to which the internal clock signal ICLK at the "H" level has been input, applies a voltage to the word line WL to start the read operation.

When the read operation is started, the sense amplifier units SAU0 to SAUn sense and determine data stored in the corresponding memory cells MC. Upon determining the read data, each sense amplifier unit SAU sets the feedback signal FBS to the "H" level. The read data for the sense amplifier unit SAUn of the above-described sense amplifier units SAU is determined last. Thus, the feedback signal FBSn set to the "H" level indicates that all the sense amplifier units SAU have been set to the "H" level.

Then, at time t1, the AND circuit 60 senses that all the feedback signals have been set to the "H" level to set the reset signal RST to the "H" level. When the reset signal RST is set to the "H" level, the internal clock generator 61 synchronously sets the internal clock signal ICLK to the "L" level. When the internal clock signal ICLK is set to the "L" level, the row decoder 11 and the sense amplifier units SAU are reset to states present before the read operation is performed.

Then, at time t2, the external controller or the like sets the clock signal CLK to the "L" level. Consequently, the semiconductor memory device 1 ends the read operation.

Now, the read operation in the semiconductor memory device 1 according to the second embodiment will be described using FIG. 7 and focusing on operations performed when the row decoder 11 and the sense amplifier units SAU are reset. FIG. 7 corresponds to FIG. 4 and additionally illustrates the clock signal ICLK.

First, at time tICLK0, the internal clock signal ICLK changes from the "L" level to the "H" level. When the internal clock signal ICLK changes to the "H" level, the row decoder 11 and the sense amplifier units SAU are activated to start the read operation.

When the read data is determined for all the sense amplifier units SAU, the reset signal RST is set to the "H" level. Then, at time tICLK1, the internal clock signal ICLK is set to the "L" level.

When the internal clock signal ICLK is set to the "L" level, the row decoder 11 and the sense amplifier units SAU are reset. Resetting the row decoder 11 sets the voltage of the word line WL to the "L" level. Resetting the sense amplifier units SAU sets the precharge signal PRE and the sense enable signal SAE to the "H" level.

As described above, the timing when the word line WL is reset in the second embodiment is earlier than time t4, when the word line WL is reset in the first embodiment. The timing when the precharge signal PRE and the sense enable signal SAE are reset in the second embodiment is earlier than time t5, when the precharge signal PRE and the sense enable signal SAE are reset in the first embodiment.

The reset signal RST may be configured using a pulse signal or may be configured to change to the "L" level in synchronism with the clock signal CLK. The feedback signal FBS may be configured to change to the "L" level at a timing when the sense amplifier units SAU are reset by the reset signal RST or to change to the "L" level in synchronism with the clock signal CLK, after having been set to the "H" level during the read operation.

[2-3] Effects of the Second Embodiment

The semiconductor memory device 1 according to the present embodiment enables the power consumption during the read operation to be further suppressed compared to the semiconductor memory device 1 according to the first embodiment. The effects of the present embodiment will be described below.

In the read operation in the semiconductor memory device, even after the determination of the data read from the memory cell is ended, a voltage is continuously applied to the selected word line during a preset period.

Thus, the controller 14 in the semiconductor memory device 1 according to the present embodiment includes the AND circuit 60. The AND circuit 60 receives the feedback signal FBS indicating that the sense amplifier units SAU have finished determining the read data. The AND circuit 60 then performs a logical AND operation on the feedback signal FBS to generate a reset signal RST. In response to the reset signal RST, the internal clock generator 61 changes the internal clock signal ICLK to the "L" level to set the row decoder 11 to the standby state. In other words, in response to the determination of the read data in all the sense amplifier units SAU, the row decoder 11 resets the voltage being applied to the word line WL.

Consequently, the semiconductor memory device 1 according to the present embodiment enables minimization of the period when the voltage is applied to the word line, allowing the power consumption during the read operation to be further suppressed compared to the semiconductor memory device 1 according to the first embodiment.

In the semiconductor memory device 1 according to the present embodiment, the sense amplifier units SAU are reset in response to the reset signal RST, and thus, the power consumption of the sense amplifier module 13 is also expected to be effectively suppressed.

[3] Modifications and the Like

The semiconductor memory device 1 according to the above-described embodiments includes a first memory element (20 in FIG. 2), a first reference resistance element (21 in FIG. 2), first and second bit lines (BL and BLb in FIG. 2), first and second transistors (30 and 31 in FIG. 2), and a first read circuit. The first memory element is enabled to take a first resistance value and a second resistance value different from the first resistance value. The first reference resistance element is configured to have a resistance value between the first resistance value and the second resistance value. The first bit line is connected to the memory element. The second bit line is connected to the reference resistance element. A first signal (PREin in FIG. 2) is input to gates of the first and second transistors. One ends of the first and second transistors are connected to a power supply terminal. The other ends of the first and second transistors are connected to the first and second bit lines, respectively. The first read circuit is configured to sense a difference in potential between the first bit line and the second bit line to determine data read from the first memory element. In a read operation on the first memory element, the first signal changes from a first logic level (an "L" level in FIG. 4) to a second logic level (an "H" level in FIG. 4) different from the first logic level in response to the determination of the data read from the first memory element, and a voltage of the first bit line lowers from a first voltage to a second voltage and a voltage of the second bit line lowers from a third voltage to the second voltage when the first signal changes to the second logic level. The third voltage is different from the first voltage.

The semiconductor memory device 1 includes a controller (14 in FIG. 1), first and second logic circuits (53 and 54 in FIG. 3). The controller is configured to issue a second signal indicating start of precharging of the first and second bit lines during the read operation. A first input terminal of the first logic circuit is connected to a first output node (OUT in FIG. 2) of the first read circuit. A second input terminal of the first logic circuit is connected to a second output node (OUTb in FIG. 2) of the first read circuit. The second signal (PRE in FIG. 4) is input to a first input terminal of the second logic circuit. A signal via an output terminal of the first logic circuit is input to a second input terminal of the second logic circuit. The first signal is output from an output terminal of the second logic circuit.

This enables the power consumption during the read operation to be suppressed.

The embodiments are not limited to the above-described first and second embodiments, and various modifications may be made to the first and second embodiments. For example, the above-described configuration of the sense amplifier module 13 is illustrative, and the present invention is not limited to this. For example, the logic circuit provided in the sense amplifier module 13 may have a different circuit configuration. The logic circuit may be any combination of a NAND circuit, an AND circuit, a NOR circuit, an OR circuit, and an inverter circuit as long as the logic circuit can output control signals allowing the same operations as those in the above-described embodiments to be performed. The configuration of the sense amplifier module 13, various control signals may be inverted. For example, in the case where the transistors 41 to 44 are p-channel MOS transistors, a waveform of the control signal SAE becomes that obtained by inverting the waveform of the control signal SAE shown in FIG. 4.

The determination of the read data as used herein may refer to any one of the voltage of the node OUT exceeding the inversion threshold for the inverter circuit 50, the voltage of the node OUTb exceeding the inversion threshold for the inverter circuit 52, and the output signal from the NAND circuit 53 being inverted.

The timings for the operations illustrated in the timing chart may deviate slightly. The present invention is not limited to the timings when the word line WL, the precharge signal PRE, and the sense enable signal SAE are changed to different logic levels as illustrated at time t4 and time t5 in FIG. 4. The timings for these signals may be interchanged with one another.

The connection as used herein refers to an electric connection and does not exclude, for example, connection of elements via another element.

The response as used herein refers to, for example, an operation in which a second signal changes in response to a change in a first signal. In other words, the response refers to a change in the second signal in synchronism with a change in the first signal. The response preferably indicates simultaneous changes in the first and second signals but includes, for example, a change delayed by a given period of time using a delay circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory element enabled to take a first resistance value and a second resistance value different from the first resistance value;
a first reference resistance element configured to have a resistance value between the first resistance value and the second resistance value;
a first bit line connected to the first memory element;
a second bit line connected to the reference resistance element;
a first transistor, a first signal being input to a gate of the first transistor, one end of the first transistor being connected to a power supply terminal, the other end of the first transistor being connected to the first bit line;
a second transistor, the first signal being input to a gate of the second transistor, one end of the second transistor being connected to the power supply terminal, the other end of the second transistor being input to the second bit line; and
a first read circuit configured to sense a difference in potential between the first bit line and the second bit line to determine data read from the first memory element, wherein
in a read operation on the first memory element, the first signal changes from a first logic level to a second logic level different from the first logic level in response to the determination of the data read from the first memory element, and a voltage of the first bit line transitions from a first voltage to a second voltage and a voltage of the second bit line transitions from a third voltage to the second voltage when the first signal changes to the second logic level, the third voltage is different from the first voltage.

2. The device of claim 1, further comprising:
a controller configured to issue a second signal indicating start of precharging of the first and second bit lines during the read operation;
a first logic circuit, a first input terminal of the first logic circuit being connected to a first output node of the first read circuit, a second input terminal of the first logic circuit being connected to a second output node of the first read circuit; and
a second logic circuit, the second signal being input to a first input terminal of the second logic circuit, a signal via an output terminal of the first logic circuit being input to a second input terminal of the second logic circuit, the first signal being output from an output terminal of the second logic circuit.

3. The device of claim 2, further comprising:
a first inverter circuit configured to invert the second signal; and
a second inverter circuit configured to invert an output signal from the first logic circuit, wherein
the first and second logic circuits are NAND circuits, and the second logic circuit performs a NAND operation on an output signal from the first inverter circuit and an output signal from the second inverter circuit.

4. The device of claim 2, further comprising:
a third transistor connected to the first memory element;
a fourth transistor connected to the first reference resistance element; and
a word line connected to gates of third and fourth transistors, wherein in the read operation, voltages of the first and second bit lines transition to a fourth voltage when the first signal is set to the first logic level, the fourth voltage is higher than the first and third voltages, and subsequently, the voltage of the first bit line transition from the fourth voltage to the first voltage and the voltage of the second bit line transition from the fourth voltage to the third voltage when a fifth voltage is applied to the word line, the fifth voltage sets the third and fourth transistors to an on state.

5. The device of claim 4, further comprising:
a second memory element enabled to take a third resistance value and a fourth resistance value different from the third resistance value;
a second reference resistance element configured to have a resistance value between the third resistance value and the fourth resistance value;
a third bit line connected to the second memory element;
a fourth bit line connected to the second reference resistance element;
a fifth transistor, a third signal being input to a gate of the fifth transistor, one end of the fifth transistor being connected to a power supply terminal, the other end of the fifth transistor being connected to the third bit line;
a sixth transistor, the third signal being input to a gate of the sixth transistor, one end of the sixth transistor being connected to a power supply terminal, the other end of the sixth transistor being connected to the fourth bit line;
a second read circuit configured to sense a difference in potential between the third bit line and the fourth bit line to determine data read from the second memory element;
a seventh transistor, one end of the seventh transistor being connected to the second memory element, a gate of the seventh transistor being connected to the word line; and
an eighth transistor, one end of the eighth transistor being connected to the second reference resistance element, a gate of the eighth transistor being connected to the word line, wherein
in a read operation on the second memory element,
the third signal changes from the first logic level to the second logic level in response to determination of data read from the second memory element, and
a voltage of the third bit line transitions from a fourth voltage to the second voltage and a voltage of the fourth bit line transitions from a fifth voltage to the second voltage when the third signal changes to the second logic level, the fifth voltage is different from the fourth voltage.

6. The device of claim 5, further comprising:
a third logic circuit, a first input terminal of the third logic circuit being connected to a first output node of the second read circuit, a second input terminal of the third logic circuit being connected to a second output node of the second read circuit;
a fourth logic circuit, a fourth signal being input to a first input terminal of the fourth logic circuit, the fourth signal being synchronized with the second signal, a fifth signal via an output terminal of the third logic circuit being input to a second input terminal of the fourth logic circuit, the third signal being output from an output terminal of the fourth logic circuit;
a third inverter circuit configured to invert the second signal;

a fourth inverter circuit configured to invert an output signal from the third logic circuit, wherein
start of charging of the third and fourth bit lines synchronize the second signal; and
the third and fourth logic circuits are NAND circuits, and the fourth logic circuit performs a NAND operation on an output signal from the third inverter circuit and an output signal from the fourth inverter circuit.

7. The device of claim 5, wherein during read operations on the first and second memory elements, a timing when data read from the first memory element is determined is different from a timing when data read from the second memory element is determined.

8. The device of claim 5, wherein during read operations on the first and second memory elements, the controller generates a fourth signal in response to determination of both data read by the first and second read circuits, and a voltage applied to the word line transitions from the fifth voltage to the second voltage based on the fourth signal.

9. The device of claim 8, wherein the controller includes a fifth logic circuit, a first input terminal of the fifth logic circuit is connected to the first read circuit, a second input terminal of the fifth logic circuit is connected to the second read circuit, the fourth signal is output from an output terminal of the fifth logic circuit.

10. The device of claim 9, wherein the fifth logic circuit is an AND circuit.

11. The device of claim 9, wherein the controller issues a sixth signal which controls a voltage applied to the word line, based on an externally received fifth signal and the fourth signal.

12. The device of claim 1, wherein the first memory element is fuse element.

13. A semiconductor memory device comprising:
a first memory element enabled to take a first resistance value and a second resistance value which is different from the first resistance value;
a first reference resistance element configured to have a resistance value between the first resistance value and the second resistance value;
a first read circuit configured to determine data read from the first memory element based on a current flowing through the first memory element and a current flowing through the first reference resistance element;
a first circuit configured to suppress the currents flowing through the first memory element and the first reference resistance element in response to determination of data read from the first memory element;
a second memory element enabled to take a third resistance value and a fourth resistance value different from the third resistance value;
a second reference resistance element configured to have a resistance value between the third resistance value and the fourth resistance value;
a second read circuit configured to determine a data read from the second memory element based on a current flowing through the second memory element and a current flowing through the second reference resistance element;
a first transistor, one end of the first transistor being connected to the first memory element;
a second transistor, one end of the second transistor being connected to the second memory element;
a third transistor, one end of the third transistor being connected to the first reference resistance element;
a fourth transistor, one end of the fourth transistor being connected to the second reference resistance element;

a word line connected to gates of the first to fourth transistors; and a second circuit configured to suppress the currents flowing through the second memory element and the second reference resistance element in response to determination of data read from the second memory element, wherein a timing when the currents flowing through the first memory element and the first reference resistance element are suppressed after the determination of the data read from the first memory element is different from a timing when the currents flowing through the second memory element and the second reference resistance element are suppressed after the determination of the data read from the second memory element.

14. A semiconductor memory device comprising:

a first memory element enabled to take a first resistance value and a second resistance value which is different from the first resistance value;

a first reference resistance element configured to have a resistance value between the first resistance value and the second resistance value;

a first read circuit configured to determine data read from the first memory element based on a current flowing through the first memory element and a current flowing through the first reference resistance element;

a first circuit configured to suppress the currents flowing through the first memory element and the first reference resistance element in response to determination of data read from the first memory element;

a second memory element enabled to take a third resistance value and a fourth resistance value different from the third resistance value;

a second reference resistance element configured to have a resistance value between the third resistance value and the fourth resistance value;

a second read circuit configured to determine a data read from the second memory element based on a current flowing through the second memory element and a current flowing through the second reference resistance element;

a first transistor, one end of the first transistor being connected to the first memory element;

a second transistor, one end of the second transistor being connected to the second memory element;

a third transistor, one end of the third transistor being connected to the first reference resistance element;

a fourth transistor, one end of the fourth transistor being connected to the second reference resistance element; and a word line connected to gates of the first to fourth transistors, wherein a timing when the data read from the first memory element is determined is different from a timing when the data read from the second memory element is determined, and a voltage applied to the word line is reset in response to the determination of the data read from the first and second memory elements.

15. The device of claim 13, wherein the first memory element is fuse element.

16. The device of claim 14, wherein the first memory element is fuse element.

* * * * *